United States Patent
Murakami et al.

(10) Patent No.: US 9,620,370 B2
(45) Date of Patent: Apr. 11, 2017

(54) METHOD OF FORMING TI FILM

(71) Applicant: TOKYO ELECTRON LIMITED, Tokyo (JP)

(72) Inventors: Seishi Murakami, Nirasaki (JP); Takaya Shimizu, Nirasaki (JP); Satoshi Wakabayashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/571,333

(22) Filed: Dec. 16, 2014

(65) Prior Publication Data
US 2015/0179462 A1 Jun. 25, 2015

(30) Foreign Application Priority Data
Dec. 25, 2013 (JP) ................................ 2013-267708

(51) Int. Cl.
| | |
|---|---|
| *H01L 21/44* | (2006.01) |
| *H01L 21/285* | (2006.01) |
| *C23C 16/14* | (2006.01) |
| *C23C 16/509* | (2006.01) |
| *C23C 16/56* | (2006.01) |
| *H01L 21/768* | (2006.01) |

(52) U.S. Cl.
CPC ........ *H01L 21/28556* (2013.01); *C23C 16/14* (2013.01); *C23C 16/509* (2013.01); *C23C 16/56* (2013.01); *H01L 21/76843* (2013.01); *H01L 21/28518* (2013.01); *H01L 21/76855* (2013.01)

(58) Field of Classification Search
CPC .................... H01L 21/28556; H01L 21/58568
See application file for complete search history.

(56) References Cited

U.S. PATENT DOCUMENTS

| | | | |
|---|---|---|---|
| 6,197,674 B1* | 3/2001 | Yoshikawa et al. | 438/597 |
| 2001/0019881 A1* | 9/2001 | Ohmoto | H01J 37/321 |
| | | | 438/584 |
| 2005/0233093 A1* | 10/2005 | Tada et al. | 427/569 |

FOREIGN PATENT DOCUMENTS

| | | |
|---|---|---|
| JP | 11-40518 A | 2/1999 |
| KR | 10-2013-0106022 A | 9/2013 |

* cited by examiner

*Primary Examiner* — Robert Bachner
(74) *Attorney, Agent, or Firm* — Nath, Goldberg & Meyer; Jerald L. Meyer

(57) ABSTRACT

A method of forming a Ti film on a substrate disposed in a chamber by introducing a processing gas containing a $TiCl_4$ gas as a Ti source and a $H_2$ gas as a reducing gas and by generating plasma in the chamber, includes introducing an Ar gas as a plasma generation gas into the chamber, converting the Ar gas into plasma to generate Ar ions, and acting the Ar ions on the Ti film to promote desorption of Cl from the Ti film.

4 Claims, 8 Drawing Sheets

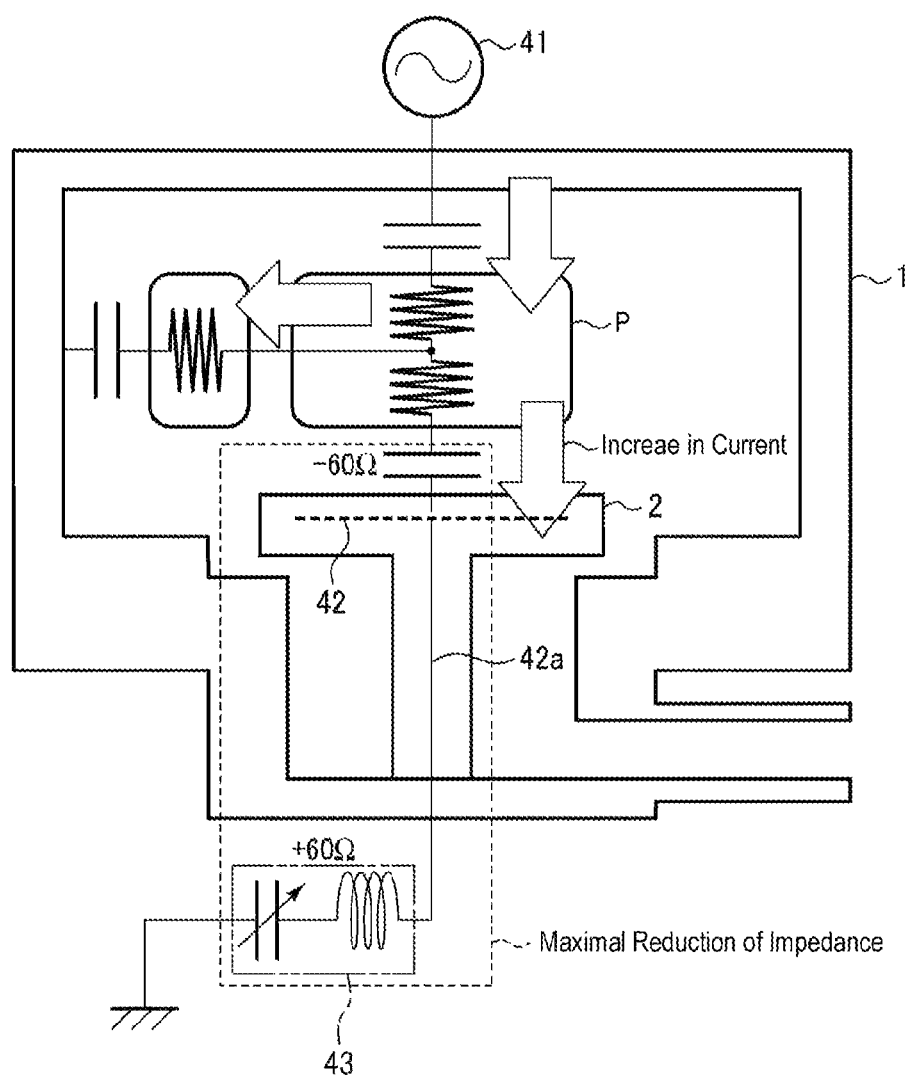

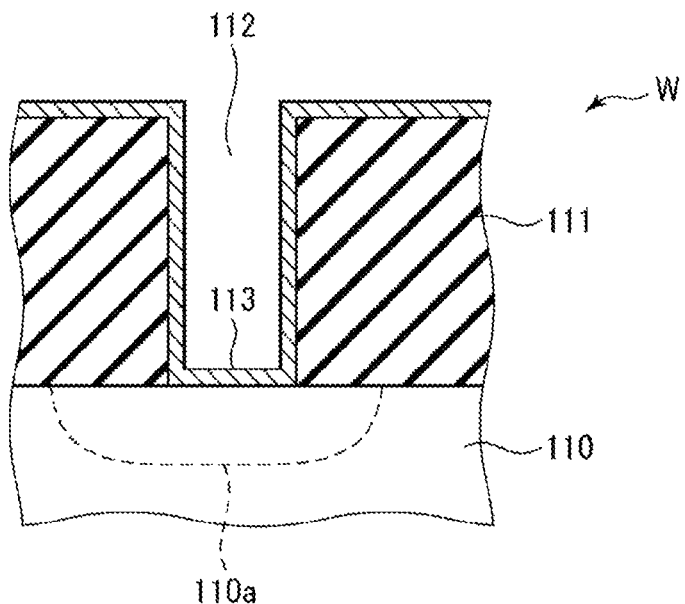
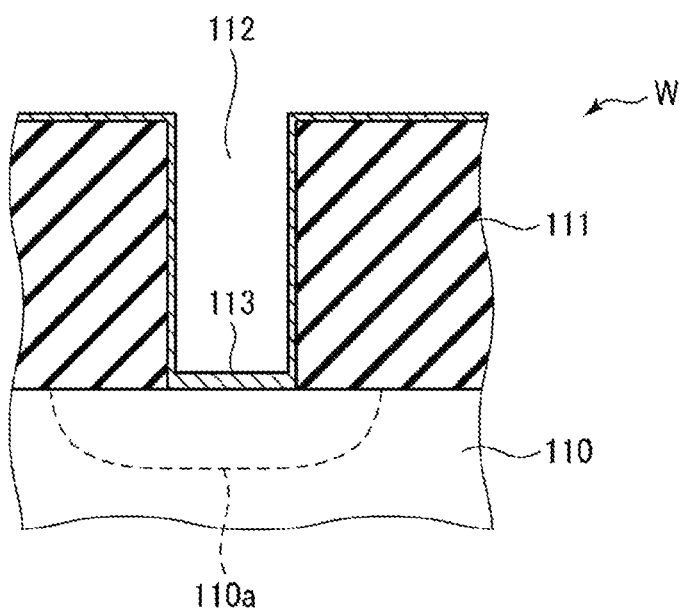

METHOD OF FORMING TI FILM

CROSS-REFERENCE TO RELATED APPLICATION

This application claims the benefit of Japanese Patent Application No. 2013-267708, filed on Dec. 25, 2013, in the Japan Patent Office, the disclosure of which is incorporated herein in its entirety by reference.

TECHNICAL FIELD

The present disclosure relates to a method of forming a Ti film.

BACKGROUND

In manufacturing semiconductor devices, in response to a recent request for high densification and high integration, circuitry tends to have a multi-layered wiring structure. For this reason, a burying technique for an electrical connection of a contact hole which connects an Si substrate as the lower layer and a wiring layer as the upper layer becomes important.

In order to make an ohmic contact between a metal wire (plug) such as a W film used to bury such a contact hole or a via hole and an Si substrate as the lower layer, a Ti film is formed on an inner side of the contact hole or a via hole prior to the burying process.

Although such a Ti film has been formed by physical vapor deposition (PVD) in the past, at request of miniaturization and high integration of devices, a chemical vapor deposition (CVD) method having better step coverage is frequently used.

In forming a Ti film using the CVD method, one technology is proposed, in which a $TiCl_4$ gas, an $H_2$ gas and an Ar gas used as film forming gases are introduced into a chamber through a shower head, while a semiconductor wafer is heated by a stage heater, high frequency power is applied to parallel flat plate electrodes to convert these gases into plasma, and the Ti film is formed by the plasma CVD method which causes the reaction between the $TiCl_4$ gas and the $H_2$ gas.

When a $TiCl_4$ gas is used to form a Ti film, a Cl gas produced by the decomposition of the $TiCl_4$ gas remains in the film, which is a factor for increasing the resistance of the Ti film. However, recently, since semiconductor devices are miniaturized and, accordingly, an spatial occupation ratio of the Ti film or other films to the buried metal in a contact hole or a via hole is increased, a Ti film having less remaining Cl and thus having low resistance is needed.

In order to reduce the resistance of a Ti film by decreasing the amount of Cl remaining therein, increasing the film forming temperature to 600 degrees C. or so for the desorption of Cl may be considered. However, due to a recent trend in which a material having a low heat resistance temperature is used in devices or from a viewpoint of prevention of impurity diffusion, the film formation at low temperature not greater than 450 degrees C. is pursued. Thus, it is impractical to form a film at high temperature.

SUMMARY

Some embodiments of the present disclosure provide a method of forming a Ti film having less remaining Cl and thus having sufficiently low resistance even when the film is formed at a low temperature.

According to one embodiment of the present disclosure, there is provided a method of forming a Ti film on a substrate disposed in a chamber by introducing a processing gas containing a $TiCl_4$ gas as a Ti source and a $H_2$ gas as a reducing gas and by generating plasma in the chamber, the method including introducing an Ar gas as a plasma generation gas into the chamber, converting the Ar gas into plasma to generate Ar ions, and acting the Ar ions on the Ti film to promote desorption of Cl from the Ti film.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 5 is a schematic view of the film forming apparatus for illustrating a function of an impedance adjustment circuit.

FIGS. 6A and 6B are views for comparing a thickness of the Ti film on an Si substrate and on an interlayer insulating film consisting of $SiO_2$ of a related art (FIG. 6A) with that of an embodiment of the present disclosure (FIG. 6B).

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, some embodiments of the present disclosure will be described in detail with reference to the accompanying drawings.

In the following description, mL/min is used as a unit of a flow rate of a gas. Since a volume of gas largely changes depending on temperature and pressure, a converted value into a standard state is used in the present disclosure. In addition, since a flow rate converted in the standard state is commonly represented in sccm (Standard Cubic Centimeter per Minutes), the unit "sccm" will be added. Here, the standard state refers to a state of a temperature of 0 degree C. (273.15K) and a pressure of 1 atm (101,325 Pa).

<Film Forming Apparatus>

Figure 1:
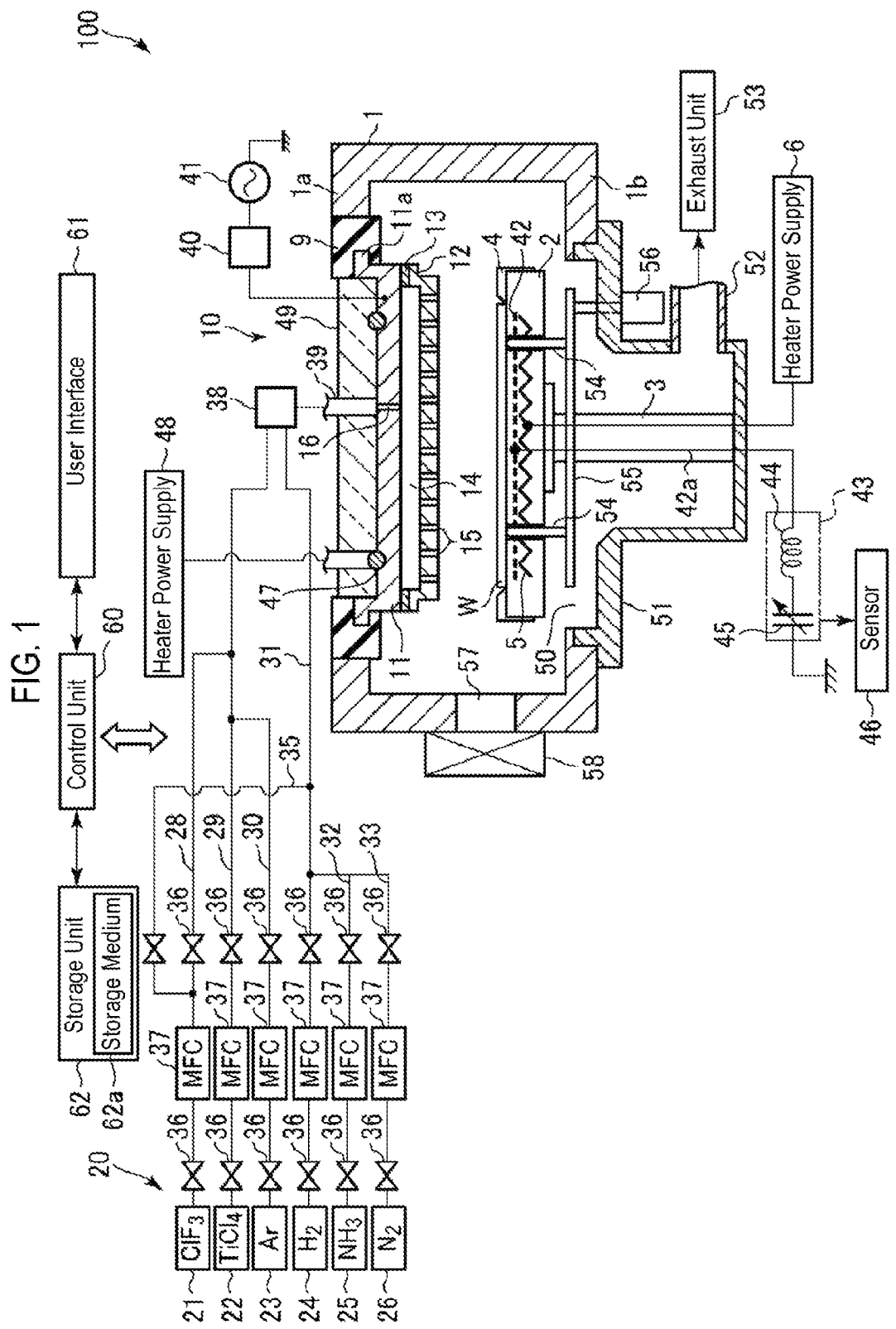
FIG. 1 is a schematic sectional view showing an example of a film forming apparatus for performing a method of forming a Ti film according to an embodiment of the present disclosure.

FIG. 1 is a schematic sectional view showing an example of a film forming apparatus for performing a method of forming a Ti film according to an embodiment of the present disclosure.

A film forming apparatus 100 is configured as a plasma CVD-Ti film forming apparatus for forming a Ti film using the CVD method while generating plasma by forming a high frequency electric field in parallel flat plate electrodes.

The film forming apparatus 100 includes a mostly circular cylindrical chamber 1. In the chamber 1, a susceptor 2 as a mounting table (stage) made of AlN to horizontally support an Si wafer (hereinafter, simply referred to as a wafer) W as a substrate to be processed is disposed to be supported by a circular cylinder-shaped support member 3 installed at the central lower portion of the susceptor 2. A guide ring 4 is installed on the outer edge portion of the susceptor 2 to guide the wafer W. In addition, a heater 5 made of a high melting point metal such as molybdenum is embedded in the susceptor 2, and the heater 5 is supplied with power from a heater power supply 6 to heat the wafer W as the substrate to be processed to a predetermined temperature.

A pre-mix type shower head 10, which also functions as an upper electrode of parallel flat plate electrodes, is installed in a ceiling wall 1a of the chamber 1 via an insulating member 9. The shower head 10 has a base member 11 and a shower plate 12, and an outer peripheral portion of the shower plate 12 is fixed by screws (not shown) to the base member 11 via an annular intermediate member 13 to prevent attaching to each other. The shower plate 12 is in the shape of a flange and has a recess formed therein, and a gas diffusion space 14 is defined between the base member 11 and the shower plate 12. The base member 11 has a flange portion 11a formed in an outer periphery of the base member 11, and the flange portion 11a is supported by the insulating member 9. The shower plate 12 has a plurality of gas discharge holes 15 formed therein, and the base member 11 has a gas introduction hole 16 formed in the vicinity of the center of the base member 11.

In addition, the gas introduction hole 16 is connected to a gas line of a gas supply mechanism 20.

The gas supply mechanism 20 includes a $ClF_3$ gas supply source 21 for supplying a $ClF_3$ gas as a cleaning gas, a $TiCl_4$ gas supply source 22 for supplying a $TiCl_4$ gas as a Ti source gas, an Ar gas supply source 23 for supplying an Ar gas used as a plasma generation gas or a purge gas, an $H_2$ gas supply source 24 for supplying an $H_2$ gas as a reducing gas, an $NH_3$ gas supply source 25 for supplying an $NH_3$ gas as a nitriding gas, and an $N_2$ gas supply source 26 for supplying an $N_2$ gas. In addition, the $ClF_3$ gas supply source 21 is connected to $ClF_3$ gas supply lines 28 and 35, the $TiCl_4$ gas supply source 22 is connected to a $TiCl_4$ gas supply line 29, the Ar gas supply source 23 is connected to an Ar gas supply line 30, the $H_2$ gas supply source 24 is connected to an $H_2$ gas supply line 31, the $NH_3$ gas supply source 25 is connected to an $NH_3$ gas supply line 32, and the $N_2$ gas supply source 26 is connected to an $N_2$ gas supply line 33. In addition, each of the gas lines is provided with a mass flow controller 37 and two valves 36 with the mass flow controller 37 interposed therebetween.

The $ClF_3$ gas supply line 28 and the Ar gas supply line 30 are connected to the $TiCl_4$ gas supply line 29. In addition, the $NH_3$ gas supply line 32, the $N_2$ gas supply line 33, and the $ClF_3$ gas supply line 35 are connected to the $H_2$ gas supply line 31. The $TiCl_4$ gas supply line 29 and the $H_2$ gas supply line 31 are connected to a gas mixing unit 38, so that the mixed gas is introduced into the gas introduction hole 16 through a gas pipe 39. Further, the mixed gas reaches the gas diffusion space 14 through the gas introduction hole 16 and is discharged to the wafer W in the chamber 1 through the gas discharge holes 15 of the shower plate 12.

The shower head 10 is connected to a high frequency power supply 41 via a matching unit 40, and the shower head 10 is supplied with high frequency power from the high frequency power supply 41. The shower head 10 functions as the upper electrode of the parallel flat plate electrodes. On the other hand, an electrode 42 which functions as a lower electrode of the parallel flat plate electrodes is embedded in the vicinity of the surface of the susceptor 2. Therefore, as the shower head 10 is supplied with high frequency power, a high frequency electrical field is formed between the shower head 10 and the electrode 42, and the high frequency electrical field causes the processing gas to be converted into plasma. The frequency of the high frequency power supply 41 is preferably set to 200 kHz to 13.56 MHz, typically 450 kHz in some embodiment.

A transmission line 42a connected to the electrode 42 is connected to an impedance adjustment circuit 43. The impedance adjustment circuit 43 is to increase the current flowing in the electrode 42 from the plasma by decreasing the impedance of the transmission line 42a viewed from a place P where plasma is generated and, for example, includes a coil 44 and a variable capacitor 45 (see FIG. 5). The current flowing in the transmission line 42a is detected by a sensor 46, and reactance of the impedance adjustment circuit 43 is controlled based on the detected value.

In addition, the base member 11 of the shower head 10 is provided with a heater 47 for heating the shower head 10. The heater 47 is connected to a heater power supply 48, and the shower head 10 is heated to a desired temperature by supplying power to the heater 47 from the heater power supply 48. A recess formed in the upper portion of the base member 11 is provided with a thermally insulating member 49.

The chamber 1 has a circular hole 50 formed in the central portion of a bottom wall 1b of the chamber 1, and the bottom wall 1b is provided with an exhaust chamber 51 protruding downward to cover the hole 50. An exhaust pipe 52 is connected to a lateral surface of the exhaust chamber 51, and an exhaust unit 53 is connected to the exhaust pipe 52. In addition, the exhaust unit 53 operates to enable the interior of the chamber 1 to be depressurized to a predetermined degree of vacuum.

Three wafer support pins 54 (only two of which are shown) for supporting and lifting the wafer W are installed in the susceptor 2 such that the wafer support pins 54 protrude from and retract into the surface of the susceptor 2, and the wafer support pins 54 are supported by a support plate 55. Further, the wafer support pins 54 are lifted up and down by a driving mechanism 56 such as an air cylinder via the support plate 55.

A lateral side of the chamber 1 is provided with a gate 57 for loading and unloading the wafer W between the chamber 1 and a wafer transfer chamber (not shown) adjacent thereto, and a gate valve 58 for opening and closing the gate 57.

The heater power supplies 6 and 48, the valves 36, the mass flow controllers 37, the matching unit 40, the high frequency power supply 41, the variable capacitor 45, the driving mechanism 56, and the like, which constitute the film forming apparatus 100, are configured to be connected to and controlled by a control unit 60 provided with a microprocessor (computer). In addition, the control unit 60 is connected to a user interface 61 having a keyboard through which an operator performs a command input to manage the film forming apparatus 100, a display configured to visually display the operational states of the film forming apparatus 100, and the like. In addition, the control unit 60 is connected to a storage unit 62 configured to store programs for realizing a variety of processes performed by the film forming apparatus 100 under the control of the control unit 60 or programs, i.e., processing recipes, for executing processes in the respective components of the film forming apparatus 100 according to various processing conditions. The processing recipes are stored in a storage medium 62a in the storage unit 62. The storage medium may be a stationary medium such as a hard disk or a portable medium such as a CD-ROM or a DVD. Alternatively, the recipes may be suitably transmitted from other devices via, e.g., a dedicated transmission line. Further, if necessary, a predetermined processing recipe is read out from the storage unit 62 under instructions from the user interface 61 and is executed by the control unit 60, whereby a desired process is performed in the film forming apparatus 100 under the control of the control unit 60.

<Method of Forming Ti Film>

Subsequently, a method of forming a Ti film which is performed using the film forming apparatus 100 will be described.

Figure 2:
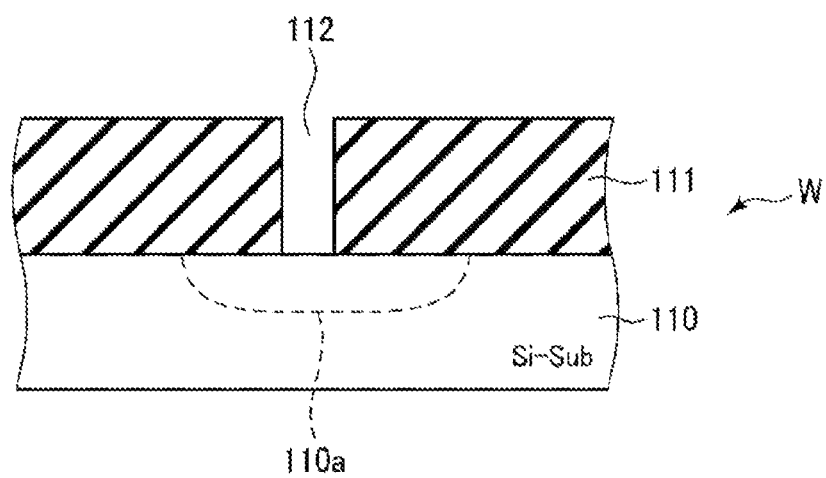
FIG. 2 is a sectional view showing an example of a wafer structure used in performing a method of forming a Ti film according to an embodiment of the present disclosure.

In the embodiment, for example as shown in FIG. 2, the wafer W may have a structure in which an interlayer insulating film 111 is formed on an Si substrate 110 and a contact hole 112 is formed in the interlayer insulating film 111 to reach an impurity diffusion region 110a of the Si substrate 110.

When a Ti film is formed on the wafer W having a structure described above by the film forming apparatus 100, after an internal pressure of the chamber 1 is adjusted, the gate valve 58 is opened, and the wafer W having the structure of FIG. 2 is loaded into the chamber 1 from the transfer chamber (not shown) through the gate 57. Then, while maintaining the interior of the chamber 1 at a predetermined degree of vacuum, a pre-flow process is performed by flowing the Ar gas that is a plasma generation gas, the $H_2$ gas that is a reducing gas, and the $TiCl_4$ gas that is a Ti source gas into a pre-flow line (not shown) at a time when the temperature of the wafer W is almost stable by preheating the wafer W. Thereafter, while maintaining a gas flow rate and pressure constant, the line is switched to a line for film formation, thereby introducing these gases into the chamber 1 through the shower head 10.

Figure 3A:
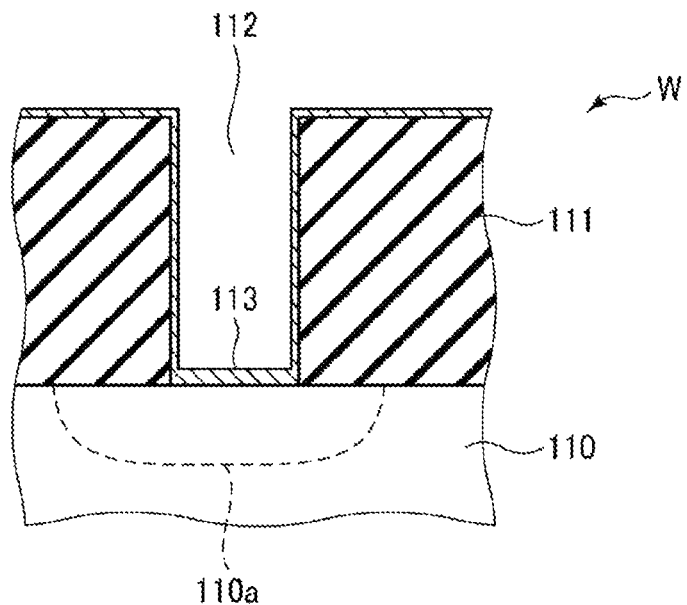
FIGS. 3A and 3B are sectional views showing states of a wafer after a Ti film is formed and then subjected to siliciding.
Figure 3B:
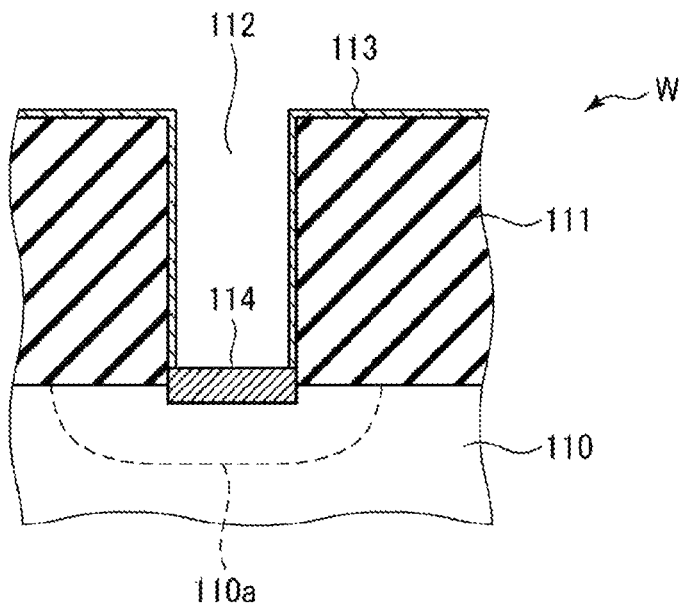

Then, after the introduction of these gases is initiated, plasma of the Ar gas, the $H_2$ gas, and the $TiCl_4$ gas introduced into the chamber 1 is generated by applying high frequency power to the shower head 10 from the high frequency power supply 41, and the gases which have been converted into plasma are allowed to react on the wafer W heated to a predetermined temperature by the heater 5. Accordingly, as shown in FIG. 3A, a Ti film 113 is deposited on the surface of the Si substrate (Si portion) 110. Then, as shown in FIG. 3B, the Ti film 113 reacts with the Si substrate 110 of the bottom of the contact hole 112, thereby forming a TiSix film 114.

Although plasma of the gases is also used in a related art when a Ti film is formed, an objective of the plasma generation is merely to increase reactivity of the gas. If the film forming temperature is not greater than 450 degrees C., it is not possible to sufficiently reduce the amount of Cl remaining in the Ti film.

Figure 4:
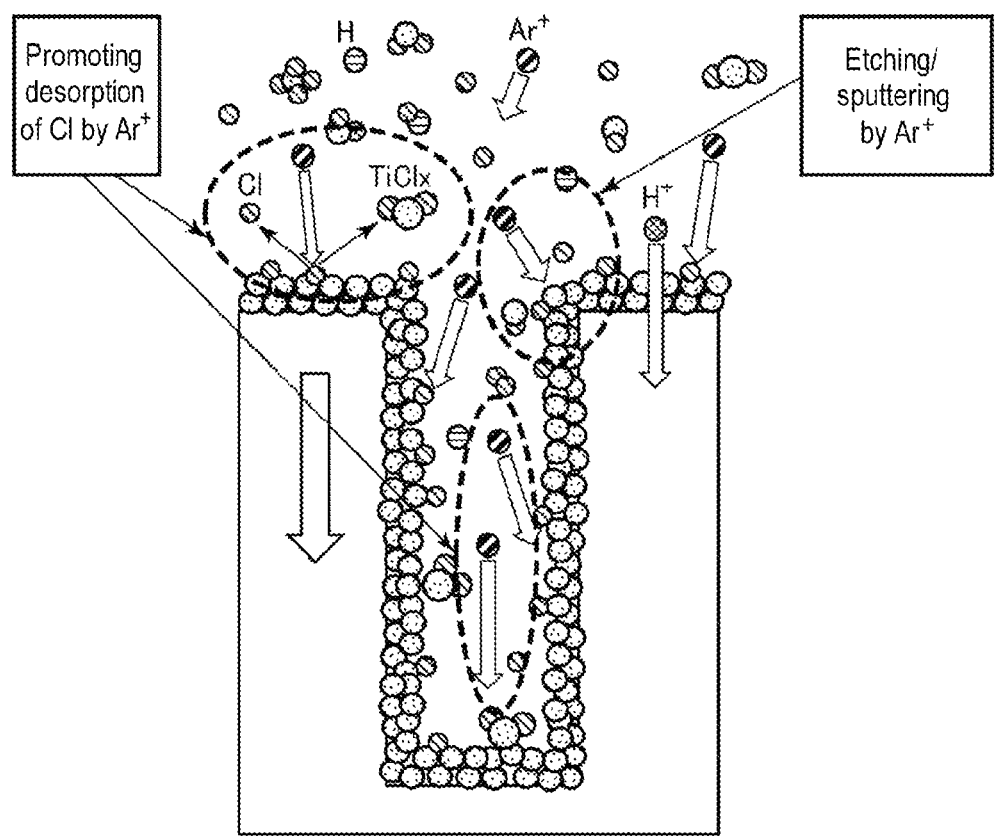
FIG. 4 is a view illustrating the mechanism of the present disclosure.

On the contrary, in the present embodiment, as shown in FIG. 4, the Ar gas that is a plasma generation gas is converted into plasma to generate Ar ions having high energy by the high frequency electric field, and the Ar ions are allowed to act on the Ti film, thereby promoting the desorption of Cl from the inside of the Ti film. Since the Ar ions move straight forward, the Ar ions reach the bottom of the contact hole, and the desorption of Cl from the Ti film in the bottom of the contact hole is also promoted. Accordingly, even when the film forming temperature is not greater than 450 degrees C., a Ti film having few remaining Cl and thus having low resistance can be obtained. In addition, the Ar ions also have an etching function and a sputtering function, thereby removing the Ti film of a flat portion or an overhang of the opening of the contact hole.

In order to allow the Cl desorption function of Ar ions to effectively occur, it is preferred, in some embodiments, to increase a flow rate of the Ar gas and high frequency power more than the related art. Accordingly, a large number of the Ar ions having high energy may be supplied to the Ti film to promote the desorption of Cl. In addition, it is preferable, in some embodiments, to increase a flow rate of the $TiCl_4$ gas and decrease a flow rate of the $H_2$ gas more than the related art. In the related art, since a reaction for producing HCl by reducing $TiCl_4$ to $H_2$ is mainly performed, as low flow rate of Ti and as high flow rate of the $H_2$ gas as possible are maintained. However, in this embodiment, since desorption of Cl is possible by the Ar gas, in a form of desorption of Cl from a TiClx state or desorption of Cl itself, a small amount of $H_2$ gas may be sufficient. In addition, it is advantageous to increase the flow rate of the $TiCl_4$ gas in order that $TiCl_4$ is allowed to sufficiently reach the bottom of the contact hole.

As described above, in order to obtain the functions of the Ar ions of the embodiment, large power is necessary. However, since a portion of the current flows in the wafer W from the plasma and more than half of the current flows in the wall portion of the chamber, if the high frequency power of a necessary output is supplied, the current flowing in the wall portion of the chamber from the plasma becomes large and thus the plasma is destabilized, whereby it is apprehended that an abnormal electrical discharge or the like may occur.

Therefore, in the film forming apparatus of FIG. 1, such a problem may be avoided by installing the impedance adjustment circuit 43 in the transmission line 42a connected to the electrode 42 in the susceptor 2 to enable the impedance of the transmission line 42a viewed from a place P where the plasma is generated to be adjusted (see FIG. 5).

That is, increasing the power is to accelerate the ions by enlarging a potential difference (V) of plasma sheath between the plasma and the wafer. According to Ohm's law (V=ZI), if the current (I) flowing in the wafer from the plasma is increased, the potential difference can be enlarged even if the high frequency power is low.

There are capacitive components such as the plasma sheath and the susceptor 2 between the plasma and the wafer W, and they function as resistors. As shown in FIG. 5, if the capacitive components are cancelled and the impedance of the transmission line 42a is maximally reduced by the impedance adjustment circuit 43, the current flowing in the transmission line 42a from the plasma through the wafer W can be effectively enlarged. For this reason, since the Ar ions can sufficiently function even in a relatively small power, it is possible to promote the film forming reaction along with the desorption of Cl. Further, although in FIG. 1, the impedance adjustment circuit 43 uses a combination of the coil 44 and the variable capacitor 45 in order that the impedance is adjusted by the variable capacitor 45, the present disclosure is not limited thereto.

In addition, by increasing the current flowing in the wafer W from the plasma, it is possible to make the current flowing in the wall portion of the chamber from the plasma relatively small. Thus, the plasma can be stabilized even when the high frequency power is increased.

In the embodiment, as described above, the Cl desorption function of Ar ions and the like can be obtained by the presence of the impedance adjustment circuit 43 even when the high frequency power is low. On that point, the high frequency power is suitably in a range of 100 to 3000 W. If the high frequency power is less than 100 W, the desorption of Cl from the inside of the Ti film and promoting the film formation may not sufficiently occur. Also, if the high frequency power exceeds 3000 W, it is apprehended that the plasma will be unstable or the plasma may be damaged.

When the Ti film is formed, the frequency of the high frequency power supplied from the high frequency power supply 41 is preferably in a range of 200 kHz to 13.56 MHz, typically 450 kHz in some embodiments. This is because such a frequency is advantageous for converting the Ar gas introduced as the plasma generation gas into Ar ions having high energy.

As described above, a film forming temperature of not greater than 450 degrees C. is preferable in terms of heat resistance of devices and prevention of impurity diffusion in some embodiments. However, since the good film quality cannot be obtained if the temperature is too low, temperature not less than 350 degrees C. is preferable in some embodiment.

The lower the internal pressure of the chamber 1 is, the further the plasma damage decreases. If the pressure is too low, in-plane uniformity (resistance value) of the Ti film remarkably deteriorates. In addition, if the pressure is too high, the resistance value of the Ti film is increased, which is undesirable. Therefore, in light of this, preferable ranges are defined.

Specific ranges of conditions for forming the Ti film are as follows:
Output of High Frequency Power: 100 to 3000 W
$TiCl_4$ Gas Flow Rate (Flow Rate for Film Formation): 1 to 100 mL/min (sccm), more preferably 3.5 to 20 mL/min (sccm)
Ar Gas Flow Rate: 100 to 10000 mL/min (sccm)
$H_2$ Gas Flow Rate: 20 to 5000 mL/min (sccm)
Internal Pressure of Chamber: 13.3 to 1333 Pa (0.1 to 10 Torr)
Wafer Temperature in Film Formation: 350 to 450 degrees C.

In addition, a duration for forming a film is appropriately set according to a film thickness desirous to be obtained. It is preferable that the Ti film have a thickness of 1 to 10 nm or so.

Figure 7A:
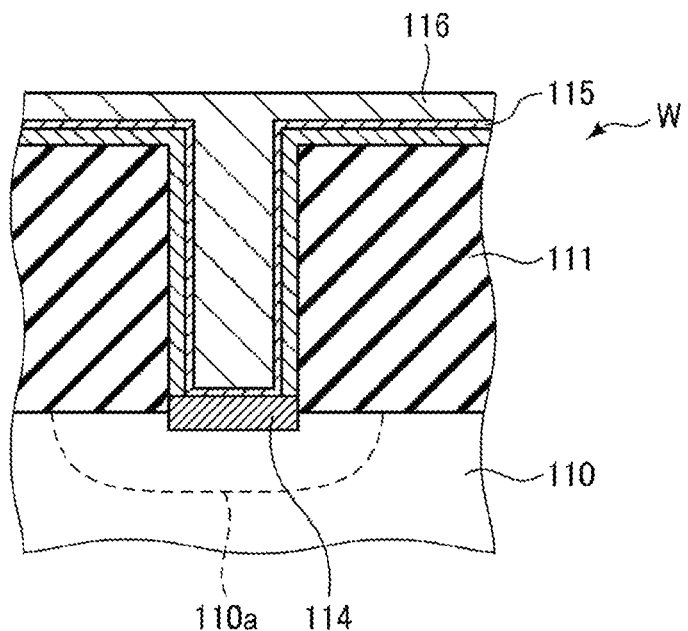
FIGS. 7A and 7B are views showing states in which from the states shown in FIGS. 6A and 6B, TiSix films are formed, TiN barrier films are formed, and then metal materials are buried, respectively.
Figure 7B:
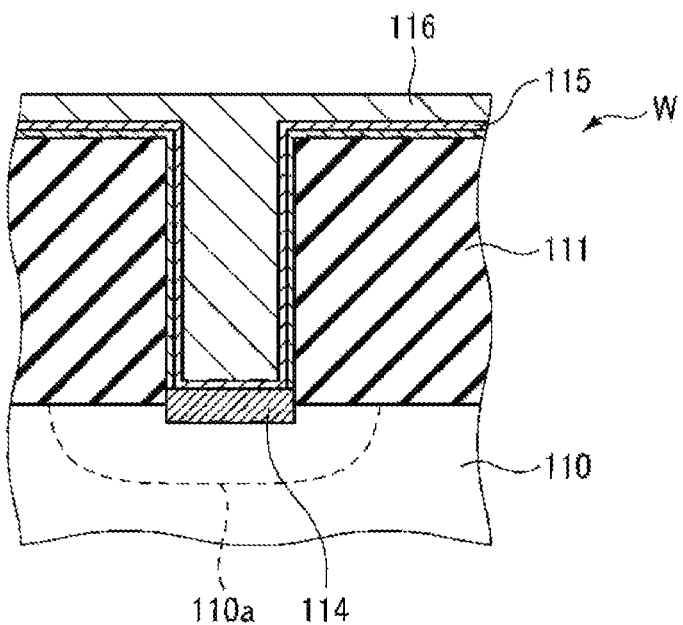

The film forming conditions in the embodiment are entirely different from those of the related art. It has found that the above-described conditions can increase selectivity of the Ti film in the film formation at a low temperature of not greater than 450 degrees C. That is, the Ti film can be formed at a high film formation rate with respect to Si and at a low film formation rate with respect to $SiO_2$. For this reason, in the related art, as shown in FIG. 6A, the Ti film 113 is formed to have almost uniform thickness on the Si substrate (Si portion) 110 and the interlayer insulating film 111 consisting of $SiO_2$. On the contrary, in the embodiment, as shown in FIG. 6B, the Ti film is formed to be thick on the Si substrate 110 in which a contact area is needed, and the Ti film is formed to be thin on the interlayer insulating film 111 consisting of $SiO_2$. Therefore, as shown in FIGS. 7A and 7B, in a case where the contact hole is filled with metal 116 after formations of the TiSix film 114 and a TiN barrier film 115, a volume of the metal 116 buried in the contact hole 112 of the present embodiment of FIG. 7B can be larger than that of the related art of FIG. 7A, thereby reducing the resistance of the buried metal (plug).

A technology of obtaining selectivity of a Ti film by a reactivity difference in a high temperature region has been known in the related art, but it is the first time to obtain the selectivity in such a low temperature region.

Figure 8:
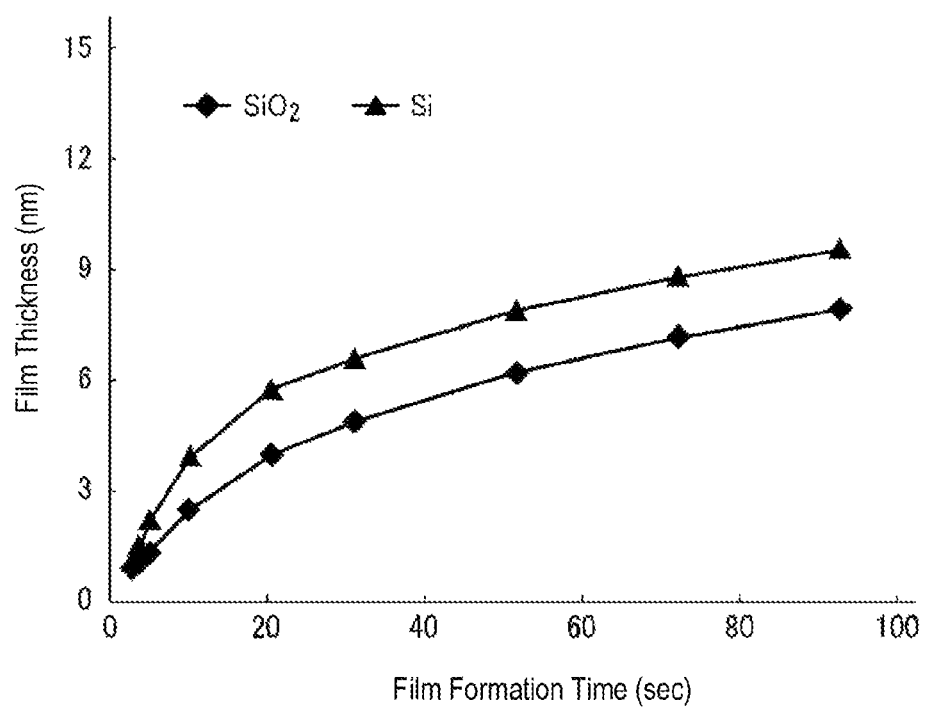
FIG. 8 is a view showing a relationship between a film formation time and a film thickness when a Ti film is formed on an Si substrate and interlayer insulating film consisting of $SiO_2$ according to an embodiment of the present disclosure.

In practice, under the following condition ranges of the embodiment, the Ti film was formed on Si and $SiO_2$.
Temperature: 450 degrees C.
$TiCl_4$ Gas Flow Rate: 20 mL/min (sccm)
Ar Gas Flow Rate: 2000 mL/min (sccm)
$H_2$ Gas Flow Rate: 20 mL/min (sccm)
Internal Pressure of Chamber: 200 Pa (1.5 Torr)
Output of High Frequency Power: 2500 W A relationship between a film formation time and a film thickness at that time is shown in FIG. 8. As shown in FIG. 8, it was confirmed that the selectivity was secured since the Ti film was formed at a higher film formation rate on Si than on $SiO_2$ under the conditions of the embodiment.

After the Ti film is formed in the above manner, the Ti film may be subjected to nitriding as necessary. In the nitriding, after the formation of the Ti film is terminated, the supply of the $TiCl_4$ gas is stopped, while the $H_2$ gas and the Ar gas continue to flow. While the interior of the chamber 1 is heated at an appropriate temperature, the $NH_3$ gas as a nitriding gas is allowed to flow and the processing gases are converted into plasma by applying high frequency power to the shower head 10 from the high frequency power supply 41. Then, the surface of Ti film is nitrided by the plasma of the processing gases.

After the Ti film is formed or subjected to the nitriding, the gate valve 58 is opened, and the wafer W is unloaded to the wafer transfer chamber (not shown) through the gate 57.

In this way, the formation of the Ti film and, as necessary, the nitriding the surface of Ti film is performed on a predetermined number of wafers and then the chamber 1 is cleaned. The cleaning process is performed, in a state where no wafer is present in the chamber 1, by introducing the $ClF_3$ gas into the chamber 1 from the $ClF_3$ gas supply source 21 through the $ClF_3$ gas supply lines 28 and 35 and heating the shower head 10 at an appropriate temperature to perform dry cleaning.

Further, although the Ti source gas and the reducing gas are simultaneously supplied to form the Ti film by using the plasma CVD method in this embodiment, the Ti film may be formed by using an atomic layer deposition (ALD) method with plasma, in which a purge by the purge gas such as Ar gas or $N_2$ gas is repeated between the supply of the Ti source gas and the supply of the reducing gas.

<Other Applications>

In addition, the present disclosure is not limited to the above-described embodiments but may be variously modified. For example, while it has been described as an example in the above embodiment that the $TiCl_4$ gas as a Ti source gas and the $H_2$ gas as a reducing gas are simultaneously supplied and the Ti film is formed by using the plasma CVD method, the Ti film may be formed by using the atomic layer deposition (ALD) method with plasma, in which a purge by the purge gas such as Ar gas or $N_2$ gas is repeated between the supply of the $TiCl_4$ gas and the supply of the $H_2$ gas. In addition, while it has been described in the above embodiments that a high frequency electric field is formed to generate plasma by applying high frequency power to the shower head, the high frequency power may be applied to the susceptor. In addition, the plasma generating mechanism is not limited to the parallel flat plate type plasma generating mechanism.

According to the present disclosure, since an Ar gas as a plasma generation gas is introduced and converted into plasma to generate Ar ions, and the Ar ions are allowed to act on the Ti film deposited on a substrate to promote desorption of Cl from the Ti film, the Ti film having few remaining Cl and thus having sufficiently low resistance may be formed even at a low temperature.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a Ti film on a substrate disposed in a chamber by introducing a processing gas containing a $TiCl_4$ gas as a Ti source and a $H_2$ gas as a reducing gas and by generating plasma in the chamber, the method comprising:

introducing an Ar gas as a plasma generation gas into the chamber;

converting the Ar gas into plasma to generate Ar ions; and acting the Ar ions on the Ti film to promote desorption of Cl from the Ti film, wherein the substrate is mounted on a mounting table installed in the chamber, an impedance adjustment circuit is connected to a transmission line connected to an electrode installed in the mounting table, and current flowing in the substrate from the plasma is increased by decreasing impedance of the transmission line viewed from a place where the plasma is generated, wherein gas flow rates when the Ti film is formed are as follows:

$TiCl_4$ gas flow rate: 1 to 100 mL/min (sccm), $H_2$ gas flow rate: 20 to 5000 mL/min (sccm), and Ar gas flow rate: 100 to 10000 mL/min (sccm), wherein a temperature when the Ti film is formed is not greater than 450 degrees C., wherein the substrate has an Si portion and an interlayer insulating film consisting of $SiO_2$ formed on the Si portion, a hole is formed in the interlayer insulating film to reach the Si portion, and when the Ti film is formed on the substrate, a film thickness of the Ti film formed on the Si portion is larger than a film thickness of the Ti film formed on the interlayer insulating film, and wherein an amount of the Ar gas is greater than an amount of the $H_2$ gas supplied in the chamber.

2. The method of claim 1, wherein an internal pressure of the chamber when the Ti film is formed is in a range of 13.3 to 1333 Pa.

3. The method of claim 1, wherein the electrode of the mounting table is made a lower electrode, an upper electrode is installed to face the lower electrode, and the upper electrode is supplied with high frequency power, thereby generating the plasma by a high frequency electric field formed between the upper electrode and the lower electrode.

4. The method of claim 3, wherein an output of the high frequency power is in a range of 100 to 3000 W.

* * * * *